(12) United States Patent
Zhong et al.

(10) Patent No.: US 8,779,853 B2
(45) Date of Patent: Jul. 15, 2014

(54) AMPLIFIER WITH MULTIPLE ZERO-POLE PAIRS

(75) Inventors: Kai Zhong, Gilbert, AZ (US); John Yu, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 558 days.

(21) Appl. No.: 13/192,301

(22) Filed: Jul. 27, 2011

(65) Prior Publication Data

US 2013/0027007 A1   Jan. 31, 2013

(51) Int. Cl.
*H03F 3/45* (2006.01)
(52) U.S. Cl.
USPC ........................................... 330/253; 330/297
(58) Field of Classification Search
USPC .......................................... 330/252–261, 297
See application file for complete search history.

(56) References Cited

U.S. PATENT DOCUMENTS 7,605,651 B2 * 10/2009 Ripley et al. ................... 330/133
8,159,301 B1 *  4/2012 Duffy et al. .................... 330/253

* cited by examiner

*Primary Examiner* — Hieu Nguyen
(74) *Attorney, Agent, or Firm* — Baker Botts L.L.P.

(57) ABSTRACT

An amplifier is disclosed. In accordance with some embodiments of the present disclosure, an amplifier may comprise a differential pair comprising a first transistor and a second transistor, wherein the first transistor comprises a first portion and a second portion, a first compensation circuit comprising a first terminal coupled to the first portion of the first transistor and a second terminal coupled to the second transistor, and a second compensation circuit comprising a first terminal coupled to the second portion of the first transistor and a second terminal coupled to the second transistor and the second terminal of the first compensation circuit.

20 Claims, 2 Drawing Sheets

AMPLIFIER WITH MULTIPLE ZERO-POLE PAIRS

TECHNICAL FIELD

The present disclosure relates generally to electronic circuits and, more particularly, to frequency compensation of amplifiers.

BACKGROUND

Operational amplifiers are used in a wide variety of integrated circuit applications. For example, low-dropout (LDO) voltage regulators may include an amplifier as part of a scheme to provide a power supply from which other circuits may be powered. LDO voltage regulators typically implement an amplifier with a feedback loop. A critical performance parameter of circuits involving a feedback loop, including an LDO voltage regulator, is the stability of the feedback loop. In order to remain stable, a feedback loop must have a sufficient amount of phase margin at its unity gain frequency. Further, to ensure proper operation across a range of potential operating conditions, a sufficient amount of phase margin must be maintained across factors such as supply voltage, temperature, and semiconductor process variation.

SUMMARY

In accordance with some embodiments of the present disclosure, an amplifier may comprise a differential pair comprising a first transistor and a second transistor, wherein the first transistor comprises a first portion and a second portion, a first compensation circuit comprising a first terminal coupled to the first portion of the first transistor and a second terminal coupled to the second transistor, and a second compensation circuit comprising a first terminal coupled to the second portion of the first transistor and a second terminal coupled to the second transistor and the second terminal of the first compensation circuit.

Technical advantages of the present disclosure may be readily apparent to one skilled in the art from the figures, description and claims included herein.

DETAILED DESCRIPTION

The present disclosure may refer to the "size" of various types of transistors, including an n-type metal-oxide semiconductor field-effect transistor (NMOS), and a p-type metal-oxide semiconductor field-effect transistor (PMOS). Unless otherwise specified, the description of a transistor's size, as used herein, describes the size parameter that affects the transconductance of the transistor. For example, for PMOS and NMOS devices, "size" may refer to the width-to-length ratio of the gate and/or of the conducting channel of the device. Accordingly, a device that is described as being sized at a ratio as compared to another device may have a transconductance that is larger or smaller at that ratio as compared to the transconductance of the other device.

Further, the present disclosure may refer to a transistor as a "mirror" of another transistor. A transistor that "mirrors" another reference device may have a gate coupled to the gate of the reference device and a source that is coupled to the same node as the source of the reference device. Accordingly, the mirror device may be configured to source or sink a current that mirrors (i.e., duplicates) the current in the reference device at a ratio that is dependent on the respective sizes of the mirror device and the reference device.

Further, the term "equivalent" may be used to describe two or more currents or two or more voltage potentials that may be designed to be approximately equal to each other. Though they may be designed to be approximately equal to each other, "equivalent" voltages, "equivalent" currents, or other "equivalent" items may include some variation due to factors including, but not limited to, device matching imperfections, semiconductor processing imperfections, and/or imbalanced operating conditions.

Figure 1:
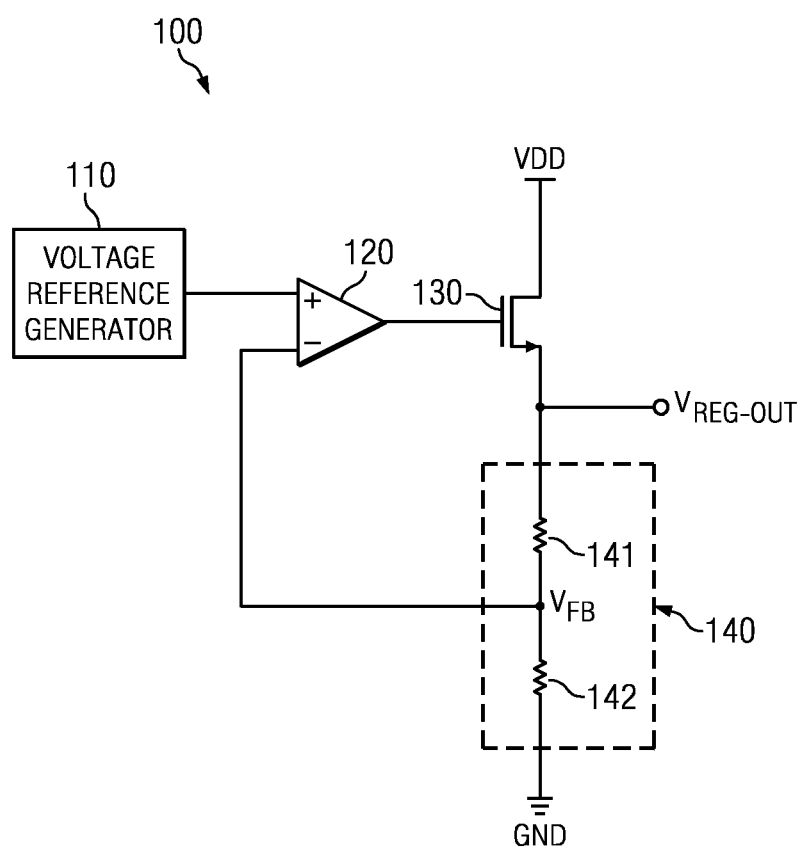
FIG. 1 illustrates a schematic diagram of an example voltage regulator.

FIG. 1 illustrates a schematic diagram of an example voltage regulator 100. Voltage regulator 100 may include a voltage reference generator 110, an amplifier 120, an output transistor 130, and a feedback network 140.

Voltage reference generator 110 may generate a stable reference voltage at its output. In some embodiments, the voltage reference generator may comprise a bandgap circuit. In some embodiments, the voltage reference generator may include a zener diode and/or any other device or circuit suitable to output a stable reference voltage. The output of the voltage reference generator 110 may be coupled to a positive input terminal of amplifier 120. Amplifier 120 may amplify the difference in the voltage potential between its positive input terminal and its negative input terminal. Output transistor 130 may have a gate coupled to the output of amplifier 120. In some embodiments, output transistor 130 may be an NMOS transistor with a drain coupled to a high potential power supply, referred to herein as "VDD," and a source coupled to a feedback network 140 and any load that may be coupled to the voltage regulator's 100 output ("$V_{reg\_out}$"). In such embodiments, $V_{reg\_out}$ may equal the amplifier output voltage minus the gate-to-source voltage of output transistor 130, and accordingly, output transistor 130 may be referred to as operating in source-follower mode.

Feedback network 140 may comprise a resistor 141 and a resistor 142. Resistor 141 may be coupled from $V_{reg\_out}$ to a feedback node ("$V_{fb}$"), and resistor 142 may be coupled from $V_{fb}$ to a low potential power supply, referred to herein as "GND." $V_{fb}$ may be coupled to the negative input terminal of amplifier 120. Accordingly, amplifier 120 may drive the output transistor to a voltage potential such that $V_{fb}$, coupled to the negative output terminal of amplifier 120, may be approximately equivalent to the reference voltage at the positive input of amplifier 120. Thus, $V_{reg\_out}$ may be driven to a voltage potential that may be represented by the following equation:

$$V_{reg\_out} \approx \text{Reference Voltage} \times \frac{R_{141} + R_{142}}{R_{142}}$$

where $R_{141}$ represents the resistance of resistor 141, and $R_{142}$ represents the resistance of resistor 142.

As described above, a critical performance parameter of circuits involving a feedback loop is the stability of the feedback loop, i.e., the feedback loop's phase margin at its unity gain frequency. To ensure stability across a range of potential operating conditions, a sufficient amount of phase margin must be maintained across factors such as supply voltage, temperature, and semiconductor process variation. For feedback loops in some integrated circuit applications, it may be desired to increase the open-loop phase around the unity gain frequency of a loop by implementing a zero-pole pair in order to improve that loop's phase margin. In some circuits, multiple zero-pole pairs may be desired to achieve a desired phase margin. However, traditional loop-compensation schemes require a separate amplifier stage to implement each zero-pole pair. Thus, in traditional loop-compensation schemes there are costs associated with implementing more than one zero-pole pair, including additional devices, current consumption, and layout area.

Figure 2:
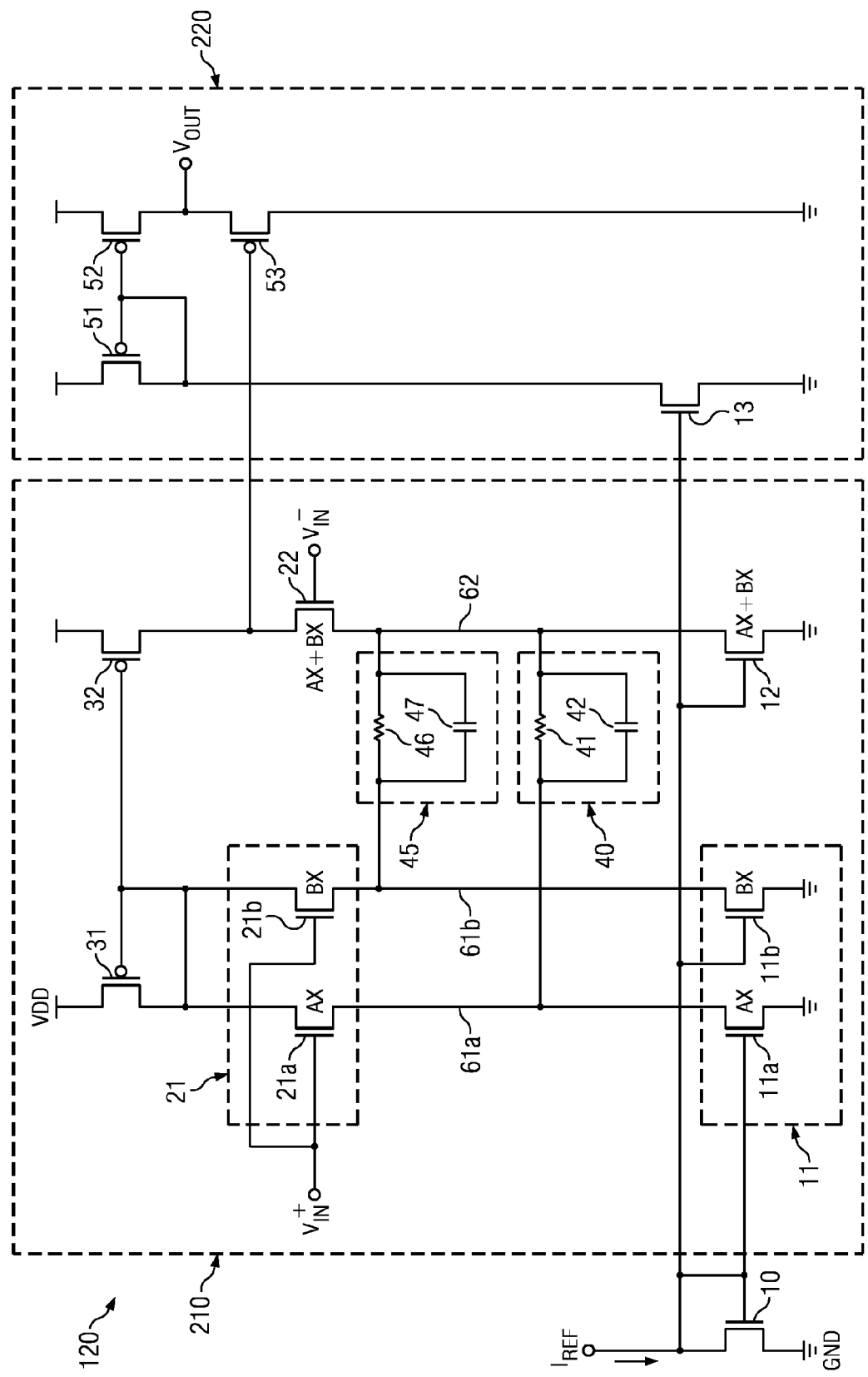
FIG. 2 illustrates a schematic diagram of an example amplifier with a multiple zero-pole pairs in one stage.

FIG. 2 illustrates a schematic diagram of an example amplifier 120 with a multiple zero-pole pairs in first stage 210. Amplifier 120 may include an NMOS 10, a first stage 210, and a second stage 220. NMOS 10 may have a source coupled to GND and a gate that may be coupled to its drain and further coupled to a reference current input, $I_{ref}$. Accordingly, NMOS 10 may be referred to as being biased by the reference current received at the $I_{ref}$ input, and the voltage potential at the gate of NMOS 10 may be used to drive the gates of other NMOS devices that mirror the current of NMOS 10.

First stage 210 may include a split NMOS 11, an NMOS 12, a split NMOS 21, an NMOS 22, a PMOS 31, and a PMOS 32. Instances of transistors may include multiple individual transistors. For example, NMOS transistors may include multiple individual NMOS devices. For the purposes of this disclosure, one or more individual NMOS devices coupled to each other in parallel may be referred to as a "portion" of an NMOS.

In some embodiments, NMOS 11 may be split into two portions, NMOS 11a and NMOS 11b. NMOS 11a may have a gate coupled to the gate of NMOS 10, a source coupled to GND, and a drain coupled to path 61a. Accordingly, NMOS 11a may mirror the reference current in NMOS 10. NMOS 11b may have a gate coupled to the gate of NMOS 10, a source coupled to GND, and a drain coupled to path 61b. Accordingly, NMOS 11b may mirror the reference current in NMOS 10. NMOS 11a may be sized at any suitable ratio as compared to the size of NMOS 11b. Accordingly, the current of NMOS 11a may be at any suitable ratio as compared to the current of NMOS 11b. In some embodiments, NMOS 11a and NMOS 11b may be configured to have equivalent sizes, and in such embodiments, NMOS 11a and NMOS 11b may accordingly have currents that are equivalent to each other.

NMOS 12 may be configured such that each individual NMOS device in NMOS 12 may be coupled together in parallel, i.e., their respective gates may be coupled together, their respective drains may be coupled together, and their respective sources may be coupled together. NMOS 12 may have a gate coupled to the gate of NMOS 10, a source coupled to GND, and a drain coupled to path 62. Accordingly, NMOS 12 may mirror the reference current in NMOS 10. NMOS 12 may have a size that is equivalent to the total combined size of NMOS 11a and NMOS 11b. Accordingly, NMOS 12 may sink a current from path 62 that is equivalent to the sum of the current that is sunk by NMOS 11a from path 61a and by NMOS 11b from path 61b.

In some embodiments, NMOS 21 may be split into two portions, NMOS 21a and NMOS 21b. NMOS 21a may have a gate coupled to the positive input terminal of amplifier 120, a source coupled to the drain of NMOS 11a via path 61a, and a drain coupled to the gate and drain of PMOS 31. NMOS 21b may have a gate coupled to a positive input terminal of amplifier 120, a source coupled to the drain of NMOS 11b via path 61b, and a drain coupled to the gate and drain of PMOS 31. NMOS 21a may be sized at any suitable ratio as compared to the size of NMOS 21b. Accordingly, the current steered by NMOS 21a may be at any suitable ratio as compared to the current of NMOS 21b. Further, the ratio of the size and current of NMOS 21a as compared to NMOS 21b may be equivalent to the ratio of the size and current of NMOS 11a as compared to NMOS 11b. In some embodiments, NMOS 21a and NMOS 21b may be configured to have the same sizes as each other, and in such embodiments, NMOS 21a and NMOS 21b may accordingly be configured to steer equivalent currents.

NMOS 22 may be configured such that each individual NMOS device in NMOS 22 may be coupled together in parallel, i.e., their respective gates may be coupled together, their respective drains may be coupled together, and their respective sources may be coupled together. NMOS 22 may have a gate coupled to a negative input terminal of amplifier 120, a source coupled to the drain of NMOS 12 via path 62, and a drain coupled to the drain of PMOS 32. NMOS 22 may have a size that is equivalent to the total combined size of NMOS 21a and NMOS 21b. Accordingly, NMOS 22 may be configured to steer a current that is equivalent to the total combined currents of NMOS 21a and NMOS 21b.

PMOS 31 may have a source coupled to VDD and a gate and a drain that may be coupled to each other and further coupled to the respective drains of NMOS 21a and NMOS 21b. Accordingly, PMOS 31 may be biased by the sum of the currents in NMOS 21a and NMOS 21b. PMOS 32 may have a source coupled to VDD and a gate coupled to the gate of PMOS 31. Accordingly, PMOS 32 may be configured to mirror the current in PMOS 31.

Compensation circuit 40 may have a first terminal coupled to the source of NMOS 21a and second terminal coupled to the source of NMOS 22. In some embodiments, compensation circuit 40 may include a resistor 41 including a first terminal coupled to the source of NMOS 21a and a second terminal coupled to the source of NMOS 22, and a capacitor 42 including a first terminal coupled to the source of NMOS 21a and a second terminal coupled to the source of NMOS 22.

Compensation circuit 45 may have a first terminal coupled to the source of NMOS 21b and second terminal coupled to the source of NMOS 22. In some embodiments, compensation circuit 45 may include a resistor 46 including a first terminal coupled to the source of NMOS 21b and a second terminal coupled to the source of NMOS 22, and a capacitor 47 including a first terminal coupled to the source of NMOS 21b and a second terminal coupled to the source of NMOS 22.

Second stage 220 may include an NMOS 13, a PMOS 51, a PMOS 52, and a PMOS 53. NMOS 13 may have a gate coupled to the gate of NMOS 10 and a source coupled to GND. Accordingly, NMOS 13 may be configured to mirror the reference current in NMOS 10. PMOS 51 may have a source coupled to VDD, and a gate and a drain that may be coupled together and further coupled to the drain of NMOS 13. Accordingly, PMOS 51 may be biased by current sunk by NMOS 13. PMOS 52 may have a source coupled to VDD and a gate coupled to the gate of PMOS 51. Accordingly, PMOS 52 may be configured to mirror the current of PMOS 51.

PMOS 53 may have a source coupled to the drain of PMOS 52, a drain coupled to GND, and a gate coupled to the drain of PMOS 32 and the drain of NMOS 22, which may be the output of first stage 210. Accordingly, PMOS 53 may be configured to operate in a source-follower mode, where the voltage potential at its source tracks the voltage potential at its gate plus the gate-to-source voltage of PMOS 53 at the current provided by PMOS 52. Thus, the output of amplifier 120, $V_{out}$, which may be coupled to the source of PMOS 53, may be equivalent to the output of the first stage 210 plus the gate-to-source voltage of PMOS 53.

Referring back to the first stage 210, the gate of NMOS 21 may be coupled to the positive input terminal of amplifier 120, and the gate of NMOS 22 may be coupled to the negative input terminal of amplifier 120. NMOS 21 and NMOS 22 may operate as a differential pair. For example, if the voltage at the gate of NMOS 21 is higher than the voltage at the gate of NMOS 22, then the voltage at the source of NMOS 21a and the voltage at the source of NMOS 21b may be higher than the voltage at the source of NMOS 22, and accordingly, current may flow across resistor 41 and resistor 46 from path 61a and path 61b to path 62. Accordingly, NMOS 21 may steer more current than NMOS 22. During such operation, the current mirrored and sourced by PMOS 32 may be larger than the drain current of NMOS 22, and accordingly, the voltage potential at the drain of NMOS 22 (i.e., the output of first stage 210) may rise. Accordingly, the output of amplifier 120 may also rise and, via the feedback network 140 depicted in FIG. 1, the negative input of the amplifier may be forced to rise to a level approximately equivalent to the positive input terminal of amplifier 120, and amplifier 120 may return to balanced operation.

Alternatively, if the voltage gate of NMOS 21 is lower than the voltage at the gate of NMOS 22, then the voltage at the source of NMOS 21a and the voltage at the source of NMOS 21b may be lower than the voltage at the source of NMOS 22, and accordingly, current may flow across resistor 41 and resistor 46 from path 62 to path 61a and path 61b. During such operation, the current mirrored and sourced by PMOS 32 may be less than the drain current of NMOS 22, and accordingly, the voltage potential at the drain of NMOS 22 (i.e., the output of first stage 210) may fall. Accordingly, the output of amplifier 120 may also fall and, via the feedback network 140 depicted in FIG. 1, the negative input of the amplifier may be forced to fall to a level approximately equivalent to the positive input terminal of amplifier 120, and amplifier 120 may return to balanced operation.

For the example embodiment depicted in FIG. 2, the open-loop gain (OLG) of the amplifier can be described as:

$$OLG \approx \frac{R_{141}}{R_{142}+R_{141}} \times r_{32}$$
$$\| r_{22} \times g_{m21} \times \left( \frac{r_{11a}\|r_{21a}}{r_{11a}\|r_{21a}+R_{41}\|\frac{1}{sC_{42}}} + \frac{r_{11b}\|r_{21b}}{r_{11b}\|r_{21b}+R_{46}\|\frac{1}{sC_{47}}} \right)$$

where: $R_{141}$ represents the resistance of resistor 141; $R_{142}$ represents the resistance of resistor 142; $r_{32}\|r_{22}$ represents the impedance looking into the drain of PMOS 32 parallel to the impedance looking into the drain of NMOS 22, i.e., the impedance at the output of the first stage 210; $g_{m21}$ represents the transconductance of NMOS 21, i.e., the total transconductance of NMOS 21a and NMOS 21b; $r_{11a}\|r_{21a}$ represents the impedance looking into the drain of NMOS 11a parallel to the impedance looking into the source of NMOS 21a; $R_{41}\|1/sC_{42}$ represents the resistance of resistor 41 in parallel to the impedance of capacitor 42 as a function of frequency; $r_{11b}\|r_{21b}$ represents the impedance looking into the drain of NMOS 11b parallel to the impedance looking into the source of NMOS 21b; and $R_{46}\|1/sC_{47}$ represents the resistance of resistor 46 in parallel to the impedance of capacitor 47 as a function of frequency.

In amplifier 120, compensation circuit 40 and compensation circuit 45 may provide frequency compensation to ensure that the loop formed by voltage regulator 100 has sufficient phase margin at its unity gain frequency to operate in a stable manner. Compensation circuit 40 may provide a first zero-pole pair at a first set of frequencies, and compensation circuit 45 may provide a second zero-pole pair at a second set of frequencies. Splitting NMOS 11 into two portions (NMOS 11a and NMOS 11b) and splitting NMOS 21 into two portions (NMOS 21a and NMOS 21b) may allow two zero-pole pairs to be implemented by compensation circuit 40 and compensation circuit 45 within first amplifier stage 120.

Though the example embodiment illustrated in FIG. 2 shows NMOS 11 and NMOS 21 as split into two portions to correspond to two compensation circuits 40 and 45, NMOS 11 and NMOS 21 may be split into any suitable number of portions to correspond to any suitable number of compensation circuits. For example, in some embodiments, NMOS 11 and NMOS 21 may each be split into three or more portions to facilitate three or more compensation circuits. Consistent with the description above, the portions of NMOS 11 may be sized at any suitable ratio as compared to each other, and the portions of NMOS 21 may be sized at any suitable ratio as compared to each other, where the ratio of the NMOS 11 portions matches the ratio of the corresponding NMOS 21 portions.

Though the example embodiment illustrated in FIG. 2 shows NMOS 11 and NMOS 21 as split into multiple portions to correspond to multiple compensation circuits 40 and 45, the opposing branch of first stage 120 may be split into multiple portions to correspond to multiple compensation circuits. For example, in some embodiments, NMOS 11 and NMOS 21 may include a single portion while NMOS 12 and NMOS 22 are split into multiple portions corresponding to multiple compensation circuits. In such embodiments, the first terminals of the respective compensation circuits may each be coupled to the single source of the single portion of NMOS 21, and the second terminals of the respective compensation circuits may be respectively coupled to the multiple sources of the multiple portions of NMOS 22.

Further, in some embodiments, both branches of first stage 120 may be split into multiple portions to correspond to multiple compensation circuits. For example, in some embodiments, NMOS 11 and NMOS 21 as well as NMOS 12 and NMOS 22 may be split into multiple portions corresponding to multiple compensation circuits. In such embodiments, the first terminals of the respective compensation circuits may be respectively coupled to the multiple sources of the multiple portions of NMOS 21, and the second terminals of the respective compensation circuits may be respectively coupled to the multiple sources of the multiple portions of NMOS 22.

As described above, second stage 220 may include PMOS 53 configured to operate in source-follower mode. In the example embodiment illustrated in FIG. 2, second stage 220 may have a substantially insignificant impact on the open-loop gain of amplifier 120 because of the operation of PMOS 53 in source-follower mode with no substantially significant gain. Second stage 220 may, however, buffer the high gain of first stage 210 from a large capacitive load that may be coupled to the output, $V_{out}$, of amplifier 120, and thus may prevent the large capacitive load from generating a dominant pole. For example, referring back to FIG. 1, voltage regulator 100 may include an output transistor 130, that may be configured with a large size capable or driving a large current load at the $V_{reg\_out}$ output. Accordingly, output transistor 130 may have a large gate capacitance. Driving the large gate capacitance of output transistor with a relatively low impedance source-follower PMOS 53 may push the pole caused by the large capacitance beyond the unity gain frequency of amplifier 120 where it does not substantially impact the stability of amplifier 120.

Though the example embodiment illustrated in FIG. 2 includes amplifier 120 including a second stage 220 with a low impedance output as described above, some embodiments of amplifier 120 may include a high impedance output. Such embodiments may include either a single stage with a high impedance output or multiple stages where the last stage may include a high impedance output. Such embodiments may be configured to drive a load with a large capacitance (e.g., output transistor 130) and may include a corresponding dominant pole at a frequency within the unity gain frequency of amplifier 120. In such embodiments, the parameters affecting the dominant pole may be designed in conjunction with compensation circuit 40 and compensation circuit 45 such that the amplifier has sufficient phase margin at its unity gain frequency to maintain stable feedback loop operation.

Though the example embodiment illustrated in FIG. 2 includes a first stage 210 including a NMOS current references (NMOS 11 and NMOS 12), an NMOS differential pair (NMOS 21 and NMOS 22), and a PMOS current mirror (PMOS 31 and PMOS 32), some embodiments may include a first stage including PMOS current references, a PMOS differential pair, and an NMOS current mirror, with multiple compensation circuits configured between the respective drains of the portions of the first differential pair PMOS and the drain of the second differential pair PMOS.

What is claimed is:

1. An amplifier, comprising:
   a differential pair comprising a first transistor and a second transistor, wherein the first transistor comprises a first portion and a second portion;
   a first compensation circuit comprising:
      a first terminal coupled to the first portion of the first transistor; and
      a second terminal coupled to the second transistor; and
   a second compensation circuit comprising:
      a first terminal coupled to the second portion of the first transistor; and
      a second terminal coupled to the second transistor and the second terminal of the first compensation circuit.

2. The amplifier of claim 1, wherein:
   the first compensation circuit comprises a first resistor and a first capacitor; and
   the second compensation circuit comprises a second resistor and a second capacitor.

3. The amplifier of claim 2, wherein:
   a first terminal of the first resistor and a first terminal of the first capacitor are coupled together at the first terminal of the first compensation circuit;
   a second terminal of the first resistor and a second terminal of the first capacitor are coupled together at the second terminal of first compensation circuit;
   a first terminal of the second resistor and a first terminal of the second capacitor are coupled together at the first terminal of the second compensation circuit; and
   a second terminal of the second resistor and a second terminal of the second capacitor are coupled together at the second terminal of second compensation circuit.

4. The amplifier of claim 1, wherein:
   the first transistor comprises a first N-type metal-oxide semiconductor field-effect transistor (NMOS);
   a gate of the first portion of the first NMOS is coupled to a gate of the second portion of the first NMOS;
   a drain of the first portion of the first NMOS is coupled to a drain of the second portion of the first NMOS;
   a source of the first portion of the first NMOS is coupled to the first terminal of the first compensation circuit;
   a source of the second portion of the first NMOS is coupled to the first terminal of the second compensation circuit;
   the second transistor comprises a second NMOS; and
   a source of the second NMOS is coupled to the second terminal of the first compensation circuit and the second terminal of the second compensation circuit.

5. The amplifier of claim 1, wherein the size of the first portion of the first transistor is equivalent to the size of the second portion of the first transistor.

6. The amplifier of claim 1, wherein the size of the second transistor is equivalent to the combined size of the first portion of the first transistor and the second portion of the first transistor.

7. An amplifier comprising, comprising:
   a first stage comprising:
      a differential pair comprising a first transistor and a second transistor, wherein the first transistor comprises a first portion and a second portion;
      a first compensation circuit comprising:
         a first terminal coupled to the first portion of the first transistor; and
         a second terminal coupled to the second transistor; and
      a second compensation circuit comprising:
         a first terminal coupled to the second portion of the first transistor; and
         a second terminal coupled to the second transistor and the second terminal of the first compensation circuit; and
   a second stage comprising a source-follower transistor comprising a metal-oxide semiconductor field-effect transistor (MOSFET) comprising a gate coupled to a first-stage output and source coupled to an amplifier output.

8. The amplifier of claim 7, wherein:
   the first compensation circuit comprises a first resistor and a first capacitor; and
   the second compensation circuit comprises a second resistor and a second capacitor.

9. The amplifier of claim 8, wherein:
   a first terminal of the first resistor and a first terminal of the first capacitor are coupled together at the first terminal of the first compensation circuit;
   a second terminal of the first resistor and a second terminal of the first capacitor are coupled together at the second terminal of first compensation circuit;
   a first terminal of the second resistor and a first terminal of the second capacitor are coupled together at the first terminal of the second compensation circuit; and
   a second terminal of the second resistor and a second terminal of the second capacitor are coupled together at the second terminal of second compensation circuit.

10. The amplifier of claim 7, wherein:
    the first transistor comprises a first N-type metal-oxide semiconductor field-effect transistor (NMOS);
    a gate of the first portion of the first NMOS is coupled to a gate of the second portion of the first NMOS;
    a drain of the first portion of the first NMOS is coupled to a drain of the second portion of the first NMOS;
    a source of the first portion of the first NMOS is coupled to the first terminal of the first compensation circuit;

a source of the second portion of the first NMOS is coupled to the first terminal of the second compensation circuit;
the second transistor comprises a second NMOS; and
a source of the second NMOS is coupled to the second terminal of the first compensation circuit and the second terminal of the second compensation circuit.

11. The amplifier of claim 7, wherein the size of the first portion of the first transistor is equivalent to the size of the second portion of the first transistor.

12. The amplifier of claim 7, wherein the size of the second transistor is equivalent to the combined size of the first portion of the first transistor and the second portion of the first transistor.

13. A voltage regulator, comprising:
a voltage reference generator;
an amplifier comprising:
  a first stage comprising:
    a differential pair comprising a first transistor and a second transistor, wherein the first transistor comprises a first portion and a second portion;
    a first compensation circuit comprising:
      a first terminal coupled to the first portion of the first transistor; and
      a second terminal coupled to the second transistor; and
    a second compensation circuit comprising:
      a first terminal coupled to the second portion of the first transistor; and
      a second terminal coupled to the second transistor and the second terminal of the first compensation circuit; and
  a second stage comprising a source-follower transistor comprising a metal-oxide semiconductor field-effect transistor (MOSFET) comprising a gate coupled to a first-stage output and source coupled to an amplifier output;
an output transistor; and
a feedback network.

14. The voltage regulator of claim 13, wherein:
the first compensation circuit comprises a first resistor and a first capacitor; and
the second compensation circuit comprises a second resistor and a second capacitor.

15. The voltage regulator of claim 14, wherein:
a first terminal of the first resistor and a first terminal of the first capacitor are coupled together at the first terminal of the first compensation circuit;
a second terminal of the first resistor and a second terminal of the first capacitor are coupled together at the second terminal of first compensation circuit;
a first terminal of the second resistor and a first terminal of the second capacitor are coupled together at the first terminal of the second compensation circuit; and
a second terminal of the second resistor and a second terminal of the second capacitor are coupled together at the second terminal of second compensation circuit.

16. The voltage regulator of claim 13, wherein:
the first transistor comprises a first N-type metal-oxide semiconductor field-effect transistor (NMOS);
a gate of the first portion of the first NMOS is coupled to a gate of the second portion of the first NMOS;
a drain of the first portion of the first NMOS is coupled to a drain of the second portion of the first NMOS;
a source of the first portion of the first NMOS is coupled to the first terminal of the first compensation circuit;
a source of the second portion of the first NMOS is coupled to the first terminal of the second compensation circuit;
the second transistor comprises a second NMOS; and
a source of the second NMOS is coupled to the second terminal of the first compensation circuit and the second terminal of the second compensation circuit.

17. The voltage regulator of claim 13, wherein the size of the first portion of the first transistor is equivalent to the size of the second portion of the first transistor.

18. The voltage regulator of claim 13, wherein the size of the second transistor is equivalent to the combined size of the first portion of the first transistor and the second portion of the first transistor.

19. The voltage regulator of claim 13, wherein the output transistor comprises a MOSFET comprising a gate coupled to the amplifier output and a source coupled to a voltage regulator output.

20. The voltage regulator of claim 13, wherein the reference generator comprises a bandgap reference.

* * * * *

UNITED STATES PATENT AND TRADEMARK OFFICE
CERTIFICATE OF CORRECTION

| | | |
|---|---|---|
| PATENT NO. | : 8,779,853 B2 | Page 1 of 1 |
| APPLICATION NO. | : 13/192301 | |
| DATED | : July 15, 2014 | |
| INVENTOR(S) | : Kai Zhong et al. | |

It is certified that error appears in the above-identified patent and that said Letters Patent is hereby corrected as shown below:

In the Claims

In column 8, line 19, in claim 7, after "amplifier" delete "comprising,".

Signed and Sealed this
Thirteenth Day of January, 2015

Michelle K. Lee
*Deputy Director of the United States Patent and Trademark Office*